US009201710B1

(12) United States Patent
Schutte (10) Patent No.: US 9,201,710 B1
(45) Date of Patent: Dec. 1, 2015

(54) SYSTEM AND METHOD FOR CONTROLLING THE SALE AND MANUFACTURE OF EQUIPMENT AND THE TRANSITION THEREBETWEEN

(71) Applicant: Smooth Logics, LLC, Holland, MI (US)

(72) Inventor: Andrew Schutte, Holland, MI (US)

(73) Assignee: Smooth Logics, LLC, Holland, MI (US)

( * ) Notice: Subject to any disclaimer, the term of this patent is extended or adjusted under 35 U.S.C. 154(b) by 109 days.

(21) Appl. No.: 13/671,397

(22) Filed: Nov. 7, 2012

Related U.S. Application Data (60) Provisional application No. 61/556,668, filed on Nov. 7, 2011.

(51) Int. Cl.
*G06F 13/00* (2006.01)
*G06F 9/54* (2006.01)

(52) U.S. Cl.
CPC ........................................ *G06F 9/54* (2013.01)

(58) Field of Classification Search
CPC ................................. G06F 9/546; G06F 17/50

USPC ............................................... 719/313; 703/1
See application file for complete search history.

(56) References Cited

U.S. PATENT DOCUMENTS

| | | | |
|---|---|---|---|
| 7,606,628 B2* | 10/2009 | Azuma | 700/107 |
| 2002/0026385 A1* | 2/2002 | McCloskey et al. | 705/27 |
| 2004/0015367 A1* | 1/2004 | Nicastro et al. | 705/1 |
| 2006/0149405 A1* | 7/2006 | Okada et al. | 700/107 |
| 2008/0066291 A1* | 3/2008 | Akai | 705/1 |
| 2010/0036866 A1* | 2/2010 | Sitton | 707/102 |
| 2011/0054655 A1* | 3/2011 | Krantz | 700/98 |
| 2012/0095884 A1* | 4/2012 | Tanabe et al. | 705/28 |

* cited by examiner

*Primary Examiner* — Andy Ho
(74) *Attorney, Agent, or Firm* — The Watson I.P. Group, PLC; Jovan N. Jovanovic; Vladan M. Vasiljevic (57) ABSTRACT

A software and implementable system which provides bi-directional communication between engineering, through software add-ins, and other applications within an ERP system. Such a system provides efficiency enhancements and provides improved data flow and communication between engineering and others. While not required, the system is well suited for application in association with manufacturing of equipment, and in particular, manufacturing of custom equipment.

5 Claims, 6 Drawing Sheets

SYSTEM AND METHOD FOR CONTROLLING THE SALE AND MANUFACTURE OF EQUIPMENT AND THE TRANSITION THEREBETWEEN

CROSS REFERENCE TO RELATED APPLICATION

This application claim priority from U.S. Provisional Patent Application Ser. No. 61/556,668 filed Nov. 7, 2011, entitled "System and Method for Controlling the Sale and Manufacturing of Equipment and the Transition Therebetween," the entire specification of which is hereby incorporated by reference.

BACKGROUND OF THE DISCLOSURE

1. Field of the Disclosure

The disclosure relates in general to software associated with design and engineering systems, and more particularly, to a system and method for controlling the transition between the sale, design, and manufacturing of equipment. The system is typically, although not specifically, configured for implementation in association with a CAD type program (i.e., so as to run in conjunction with or within the CAD type program). The system can be implemented in a number of different configurations, and it will be understood that the current disclosure is not limited to any particular configuration.

2. Background Art

The use of Enterprise Resource Management systems and programs is known in the art. Typically, it becomes necessary for an organization to control and manage projects (in many instances, the manufacture of components, equipment or other items). To manufacture a multi-component piece of equipment, interaction between a great number of departments is required. For example, this includes the engineering team, the sales force, the procurement department, the manufacturing department, among others. In addition, there is interaction with outside vendors and suppliers.

Problematically, it has been difficult for the different departments to communicate and exchange data. As such, efficiency is lost. For example, in a typical operation, it is necessary to have levels of management within the engineering department for larger projects. It has been determined through case studies that upwards of 30% or more of an engineer's time is spent performing activities and tasks that can be categorized as "non-engineering." Any time that is spent on such activities and tasks makes the engineer less efficient with respect to engineering and takes time away from the primary task that is given to the engineer.

Additionally, without communication with engineering, it is difficult to determine the timeliness of various engineering tasks as well as the changes/revisions that are made as a project proceeds from beginning to end. In many instances, while the engineering department has made changes to a particular component, purchasing has ordered the non-revised component because it was unaware of the revision. In other instances, revisions are not properly tracked with respect to inventory and the like. Still other problems persist without the interactive and bi-directional communication between engineering and other departments.

It would be advantageous if a system was provided that effectively provided a bi-directional communication system with engineering and true bi-directional software integration for engineering.

SUMMARY OF THE DISCLOSURE

The disclosure is directed to one or more computer-readable media comprising computer-executable instructions for providing bi-directional communication with a CAD system. In particular, the computer-executable instructions perform steps comprising: providing at least one drawing pertaining to at least one part within the CAD software; providing data pertaining to the at least one drawing to at least one software application outside of the CAD software; altering the data provided to the at least one outside software application; and providing the altered data back to the CAD software for association with the at least one drawings.

In a preferred embodiment, the at least one software application outside of the CAD software comprises job scheduling software.

In another preferred embodiment, the at least one software application outside of the CAD software comprises an engineering application.

In yet another preferred embodiment, the at least one software application outside of the CAD software comprises a purchasing application.

Preferably, the data pertaining to the at least one drawing comprises data pertaining to an inventory quantity of the part.

In another preferred embodiment, the data pertaining to the at least one drawing comprises data pertaining to a plurality of products that include the part.

In yet another preferred embodiment, the data pertaining to the at least one drawing comprises data pertaining to the number of such parts ordered and as the sufficiency of the quantity ordered.

In a preferred embodiment, the data pertaining to the at one drawing comprises data pertaining to completion date for the part.

In another aspect of the disclosure, the disclosure is directed to a system for providing bi-directional communication with a CAD system. The system comprises a set of metadata associated with a drawing of a CAD system. The system further includes an add-in configured to communicate metadata from the drawing to an outside data processing system. The add-in provides data to the outside data processing system, and also communicates changes to the metadata back to the drawing for association and use in the CAD system.

In a preferred embodiment, the add-in is configured to exchange data bi-directionally with the CAD system.

In another preferred embodiment, the outside data processing system comprises one of the group selected from job scheduler, engineering application and purchasing application.

BRIEF DESCRIPTION OF THE DRAWINGS

The disclosure will now be described with reference to the drawings wherein.

DETAILED DESCRIPTION OF THE DISCLOSURE

While this invention is susceptible of embodiment in many different forms, there is shown in the drawings and described herein in detail a specific embodiment with the understanding that the present disclosure is to be considered as an exemplification and is not intended to be limited to the embodiment illustrated.

It will be understood that the system is described for use in association with a CAD (computer aided drafting) software, such as, for example, SolidWorks, which is available from Dassault Systemes SolidWorks of Concord, Mass. Of course, the system may be utilized with other CAD software, including, but not limited to, C ATIA, Pro/Engineer, AutoCAD, among others. There is no CAD based limitation to the particular software which the system can be applied, and the description disclosed herein with reference to SolidWorks is solely illustrative.

Figure 6:
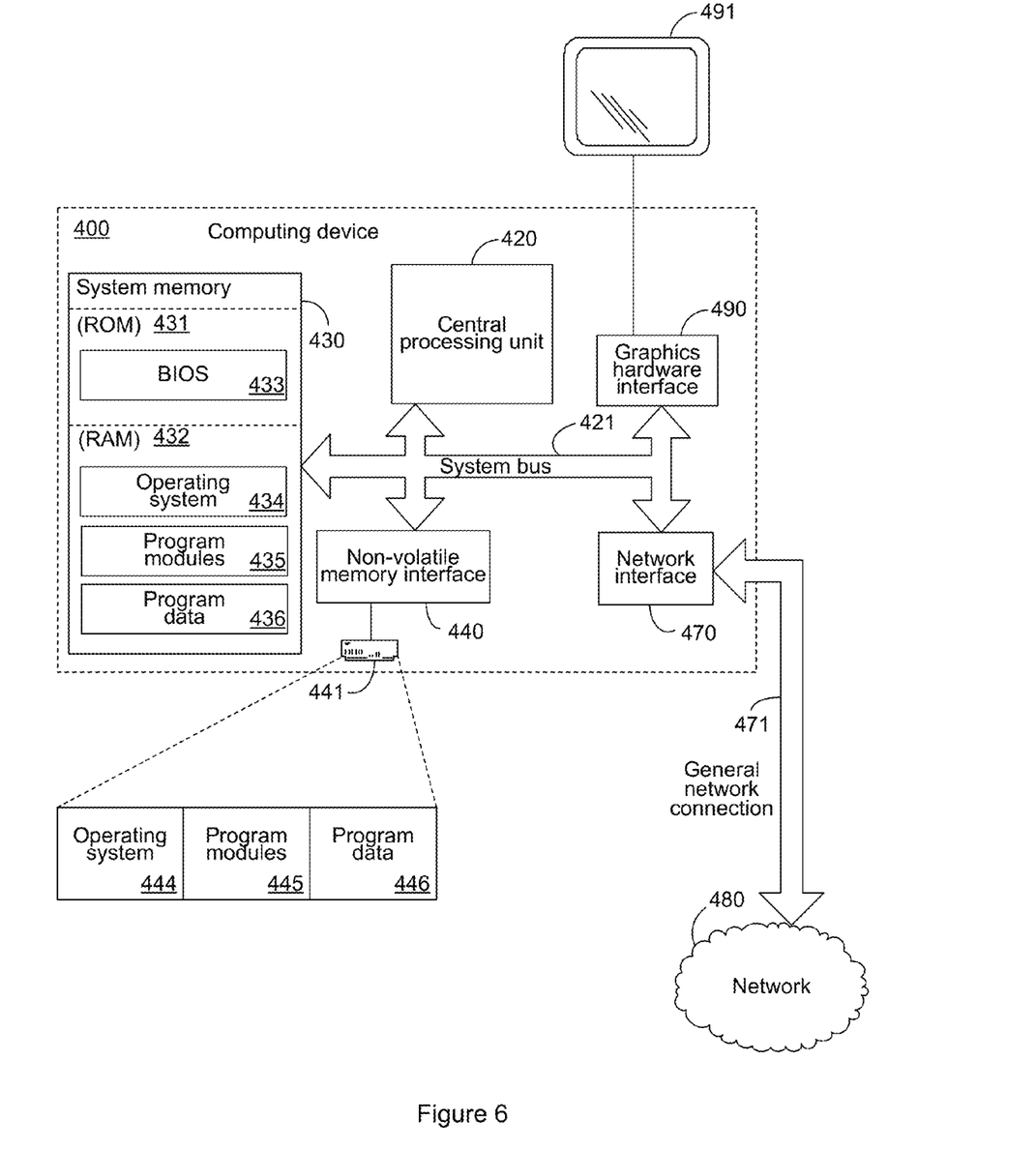
FIG. 6 of the drawings is a schematic representation of a computing device upon which the present software can operate.

The system is typically implemented on one or more computing devices, such as the exemplary computing device 400 of FIG. 6. The exemplary computing device 400 of FIG. 6 can include, but is not limited to, one or more central processing units (CPUs) 420, a system memory 430, that can include RAM 432, and a system bus 421 that couples various system components including the system memory to the processing unit 420. The system bus 421 may be any of several types of bus structures including a memory bus or memory controller, a peripheral bus, and a local bus using any of a variety of bus architectures. The computing device 400 can optionally include graphics hardware, such as for the display of visual user interfaces, including, but not limited to, a graphics hardware interface 490 and a display device 491. Depending on the specific physical implementation, one or more of the CPUs 420, the system memory 430 and other components of the computing device 400 can be physically co-located, such as on a single chip. In such a case, some or all of the system bus 421 can be nothing more than silicon pathways within a single chip structure and its illustration in FIG. 4 can be nothing more than notational convenience for the purpose of illustration.

The computing device 400 also typically includes computer readable media, which can include any available media that can be accessed by computing device 400 and includes both volatile and nonvolatile media and removable and non-removable media. By way of example, and not limitation, computer readable media may comprise computer storage media and communication media. Computer storage media includes media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 400. Communication media typically embodies computer readable instructions, data structures, program modules or other data in a modulated data signal such as a carrier wave or other transport mechanism and includes any information delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

Figure 4:
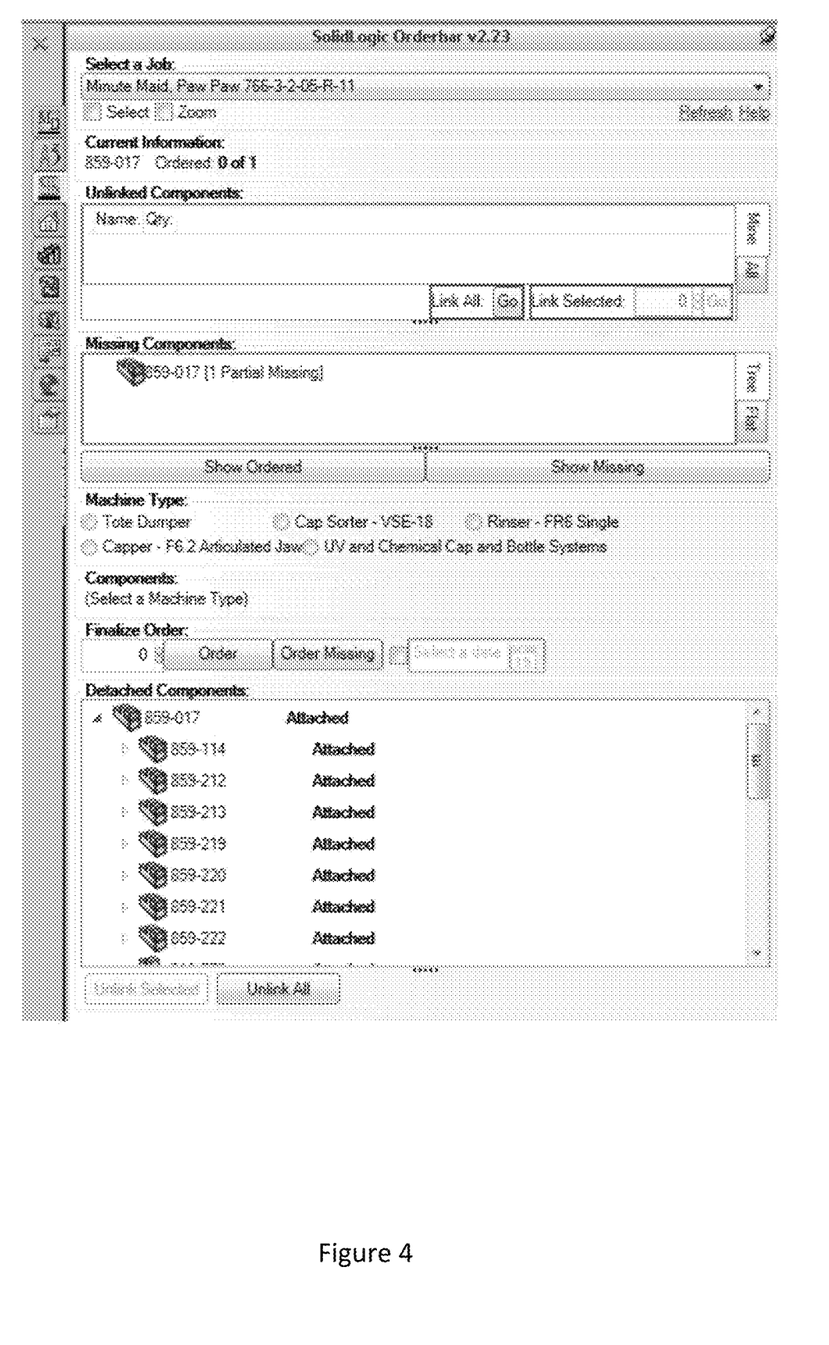
FIG. 4 of the drawings is a sample window display within the CAD software (SolidWorks in this embodiment) of the Order Add-in utilizing the principles of the present disclosure.

The system memory 430 includes computer storage media in the form of volatile and/or nonvolatile memory such as read only memory (ROM) 431 and the aforementioned RAM 432. A basic input/output system 433 (BIOS), containing the basic routines that help to transfer information between elements within computing device 400, such as during start-up, is typically stored in ROM 431. RAM 432 typically contains data and/or program modules that are immediately accessible to and/or presently being operated on by processing unit 420. By way of example, and not limitation, FIG. 4 illustrates the operating system 434 along with other program modules 435, and program data 436.

The computing device 400 may also include other removable/non-removable, volatile/nonvolatile computer storage media. By way of example only, FIG. 6 illustrates the hard disk drive 441 that reads from or writes to non-removable, nonvolatile media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and the like. The hard disk drive 441 is typically connected to the system bus 421 through a non-removable memory interface such as interface 440.

The drives and their associated computer storage media discussed above and illustrated in FIG. 6, provide storage of computer readable instructions, data structures, program modules and other data for the computing device 400. In FIG. 6, for example, hard disk drive 441 is illustrated as storing operating system 444, other program modules 445, and program data 446. Note that these components can either be the same as or different from operating system 434, other program modules 435 and program data 436. Operating system 444, other program modules 445 and program data 446 are given different numbers hereto illustrate that, at a minimum, they are different copies.

The computing device 400 can operate in a networked environment using logical connections to one or more remote computers. The computing device 400 is illustrated as being connected to the general network connection 471 through a network interface or adapter 470 which is, in turn, connected to the system bus 421. In a networked environment, program modules depicted relative to the computing device 400, or portions or peripherals thereof, may be stored in the memory of one or more other computing devices that are communicatively coupled to the computing device 400 through the general network connection 471. It will be appreciated that the network connections shown are exemplary and other means of establishing a communications link between computing devices may be used.

Figure 1:
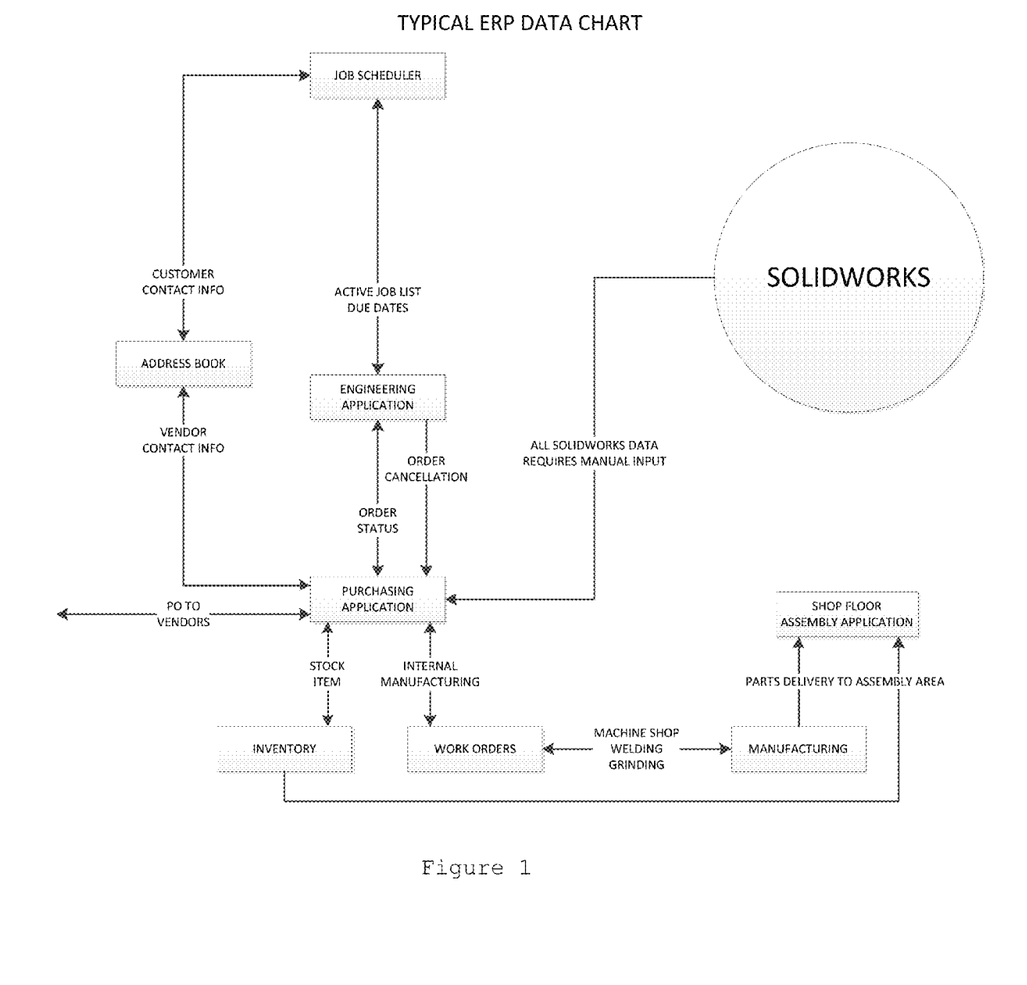
FIG. 1 of the drawings is a schematic representation of a typical ERP Data Chart.

A typical ERP (Enterprise Resource Planning) system as interfaced with a CAD (computer aided drafting) software program is shown in FIG. 1. In particular, the activities start with a purchase of a piece of equipment. Often times, the particular piece of equipment is a custom piece of equipment. That is, the actual equipment is slightly different than any other piece of equipment manufactured by the manufacturer. For example, a bottle filling equipment manufacturer makes bottle filling equipment. However, for each piece of equipment that is purchased, typically, the requirements, and in turn the design, are slightly different, and have slightly different requirements.

With continued reference to FIG. 1, generally, when an order is received, it is typically quoted with respect to price and a delivery date or time period is provided. This typically occurs in the job scheduler. There are a number of different job scheduling software programs which are commercially available. From there a plurality of jobs or sub-jobs are delineated with deadlines that insure that the overall delivery date will be met. Advantageously, the dates for the different deadlines are determined backwards from the delivery date. The dates are determined through past experience with the same or similar jobs. The different responsibilities are delineated to the engineers and the engineers (often through an engineering program) are provided with tasks. Of course, the system can operate with deadlines that are determined through a number of different algorithms and manners, however, it will be understood that it is preferred that the deadlines are computed based upon the delivery date.

The engineers typically utilize a design software (i.e., solidworks) to design the parts and components that were assigned to them by supervisors and managers. The engineer will then communicate with purchasing to make sure that the different designed components are purchased. In many instances, the drawings that are made by the engineer or designer are provided to the purchasing department, and the data is used to order the necessary components. In many instances, the systems do not communicate and a large amount of data entry is necessary to order the parts and components needed to complete the equipment that was ordered.

The purchasing application (or purchasing department) through the use of software determines whether an outside vendor will make the particular part or component, if the part or component is in inventory, or, if the part or component will be internally manufactured. If an outside vendor is utilized, a purchase order is generated and transmitted to the outside vendor. If, on the other hand, the part lies in inventory, then the item is not purchased. Similarly, if the part or component will be manufactured internally, a work order is generated and transmitted to the shop floor to have the component manufactured.

At some point, the assembly shop floor has software to track the different components and whether these components are coming from an outside vendor, current inventory or current work orders. When the necessary parts are procured, made or otherwise obtained, the shop floor assembles the components to finalize the piece of equipment.

As can be seen from the chart, there is little interaction between the design software (i.e., Solidworks) and the entire process from job creation to the shipping of the final piece of equipment. To the contrary, the engineers and designers are constantly working within the design software. Thus, on many occasions, the engineers and designers are distracted from the tasks of engineering and designing to complete tasks, to follow up and to accomplish clerical in nature tasks to keep the process flowing and to complete the piece of equipment.

Problematically, the lack of integration and bi-directional communication between the engineers (through the design software) and the remainder of the process leads to redundancies, inefficiencies, and lack of consistency. A large improvement can be gleaned from such a communication with the design software to increase engineering productivity, interdepartmental communication, data consistency and production efficiency.

Figure 2:
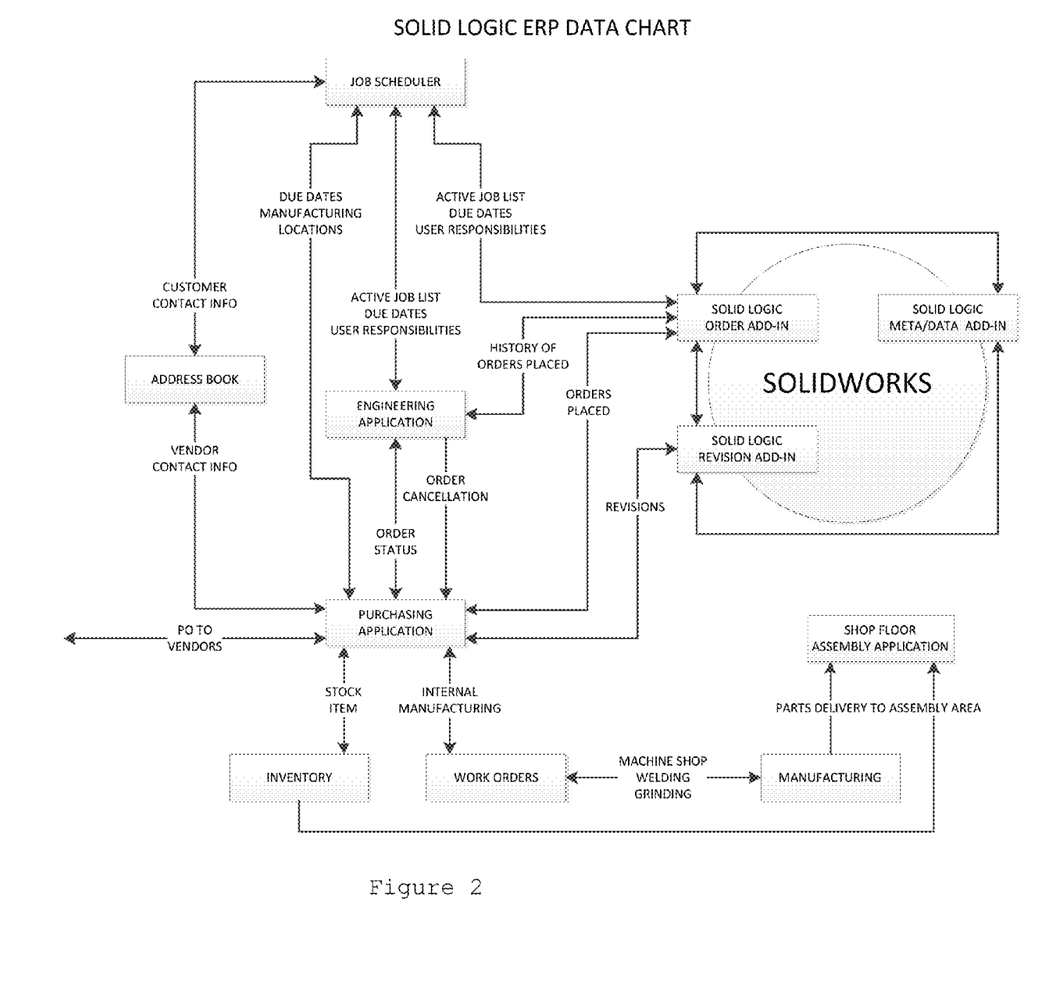
FIG. 2 of the drawings is a schematic representation of a ERP Data Chart utilizing the principles of the present disclosure.

To provide such an improvement, a plurality of software add-ins are provided to provide bi-directional communication between the design software and the remaining ERP system. The improved system is shown in FIG. 2 as including the order add-in, the meta/data add-in and the revision add-in. With these three add-ins productivity increases as engineers spend more time engineering, and the inter-departmental communication becomes bi-directional and substantially instantaneous. It will be understood that the above-described add-ins and the functionality thereof can be replicated in fewer or greater add-ins. For example, the functionality can be captured in a single add-in.

Figure 3:
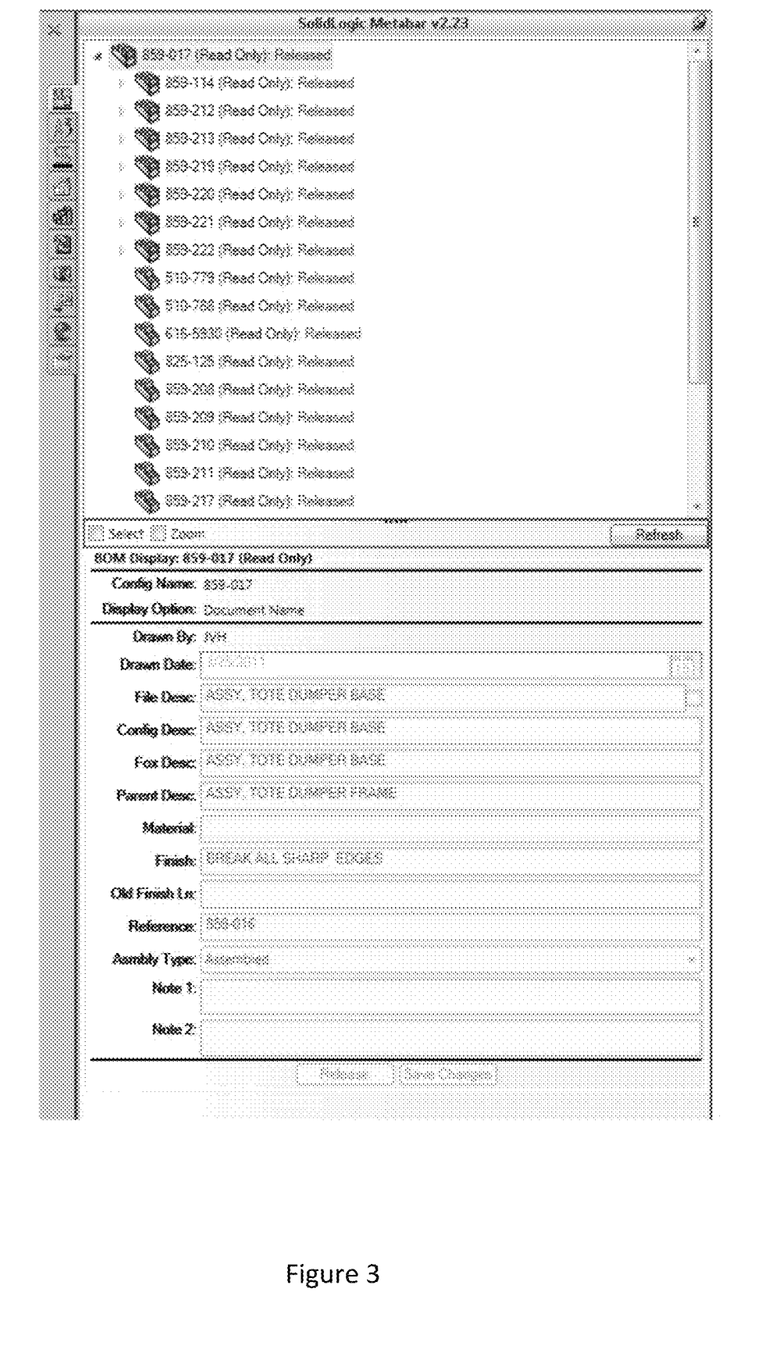
FIG. 3 of the drawings is a sample window display within the CAD software (SolidWorks in this embodiment) of the Meta/Data Add-in utilizing the principles of the present disclosure.

The first of the three add-ins comprises a meta/data add-in. The meta/data add-in provides access to the various components and the metadata associated with each. With reference to FIG. 3, a meta/data window includes a listing, in a tree view, of the various components that are available. When any one of the items is selected, the metadata is displayed for that particular component. If any of the fields are updated, the document information is dynamically updated. The values may be editable or may be read only depending on the user access. For example, if a user "owns" the document, then the values in the metadata can be editable. On the other hand, if the user does not "own" the document, then the values are read only.

With newly designed components, the engineer or designer is required to enter certain metadata, at which point they may release the component. The component remains local until the user has released the component. Once released, the software will save the metadata locally, as well as into a database (i.e., SQL, or the like). A released component is maintained in the database and is accessible to all users (or a predetermined group of users) as an available part or assembly.

The metadata add-in is not intended to be job specific, and, it is preferred that it is job independent. The documents from which the components originate, and on which the metadata is saved, are preferably stored in a large database or storage system which is accessible to all users that may have a need for such a document.

The second of the three add-ins comprises an order add-in. The order add-in communicates, in a bi-directional manner, with the job scheduling software in a bi-directional manner, the engineering application and the purchasing application. The order add-in communicates with the job scheduler to have an active bi-directional list of jobs as well as corresponding due dates and user responsibilities. Additionally, the order add-in communicates with the engineering application and the purchasing application to maintain a history of the orders that are placed. The order add-in also communicates with the metadata add-in and the revision add-in.

As with the meta/data add-in, the order add-in can be viewed from within the CAD program. A sample graphical user interface (GUI) is shown in FIG. 4. At the top is a pull-down menu listing the active jobs, from which the user can select a job that he or she is working on at that moment. Once selected, current order information is shown for that job. In this case, item number 859-017 has been ordered. However, the indication is that "0 of 1" has been ordered. The meaning of this is that there are not enough components or sub-parts on order to make a full quantity of the item. The missing components are identified in the area titled "Missing Components", and the particular component that is missing can be identified. In this case, there is an indication that there are components that are missing.

Above the missing components, there is an indication of components that have been ordered for the selected job, and are a sub-component of the component that is being viewed, but are not associated with the component being viewed.

Within a particular job, a number of different machine types may exist. For example, in FIG. 4, the job includes five different machine types. Below the machine types area is an area which includes the various components that would correspond to each of the five different component machines. Thus, when a machine type is selected, the field of the various components is populated. Significantly, for the user that is logged into the system, there is an indication that is provided as to the responsibilities for that user. For example, the machine type may appear in a color (i.e., blue) to indicate that the user has a responsibility within that machine type (to contrast, the text may appear black if there is no responsibility for the user). If there is a responsibility that is due within the week, for example, the color would change to a second different color (i.e., yellow). If a responsibility is overdue, the color of the text would appear in a different color (i.e., red). Finally, if there was a responsibility that has been completed, then the resulting color would be green.

Similarly, within each machine type, there are a number of components. The text of the components can likewise be manipulated to provide the user with a visual feedback as to the responsibilities of that user. For example, if the text is black, the user is not responsible for that component. If the text is blue, the user is responsible for that component, but any deadline associated with that component is in the future and while approaching, is not considered an impending deadline. If the text is yellow, then the user is responsible for that component, and there is an impending deadline (i.e., 7 days, 10 days, 2 weeks, etc.). If the text is red, then the user is responsible for that component, and there is a deadline that has passed. If the text is green, then the user is responsible for that component, and the task has been completed. Of course, other colors may be utilized to represent any of the foregoing, and further colors may be utilized to provide visual recognition of other conditions that are present.

When a machine type and a component is selected, the ordering process may continue. The user can select the quantity of that component to order, or if there has been a partial order, the user can order the remaining components. Once the user selects on the "order" button, the system generates a parts list and parts information that is automatically transmitted to the purchasing department. The system generates the different parts information and the parts lists based on the data that is stored in the database of parts and components.

Finally, the system also provides for items that are on order that are not a part of a current assembly. For example, if parts are ordered, and, there is no need for the part any longer, the system will show that there is a part on order that is not utilized. The user can then track the item and has options as to whether the item needs to be added to a different machine type, if the order needs to be cancelled, or if other action needs to be taken.

It will also be understood that other data may be appended from outside of the system. For example, if it is known that a particular sensor is required (but not included in the drawing) for each utilization of a particular part, ordering can append to the drawing the part number of the sensor, such that when the user triggers an order from the CAD software, the sensor is automatically ordered. Thus, data can be appended back to the drawing that can then be utilized by the ordering add-in through the CAD software.

Figure 5:
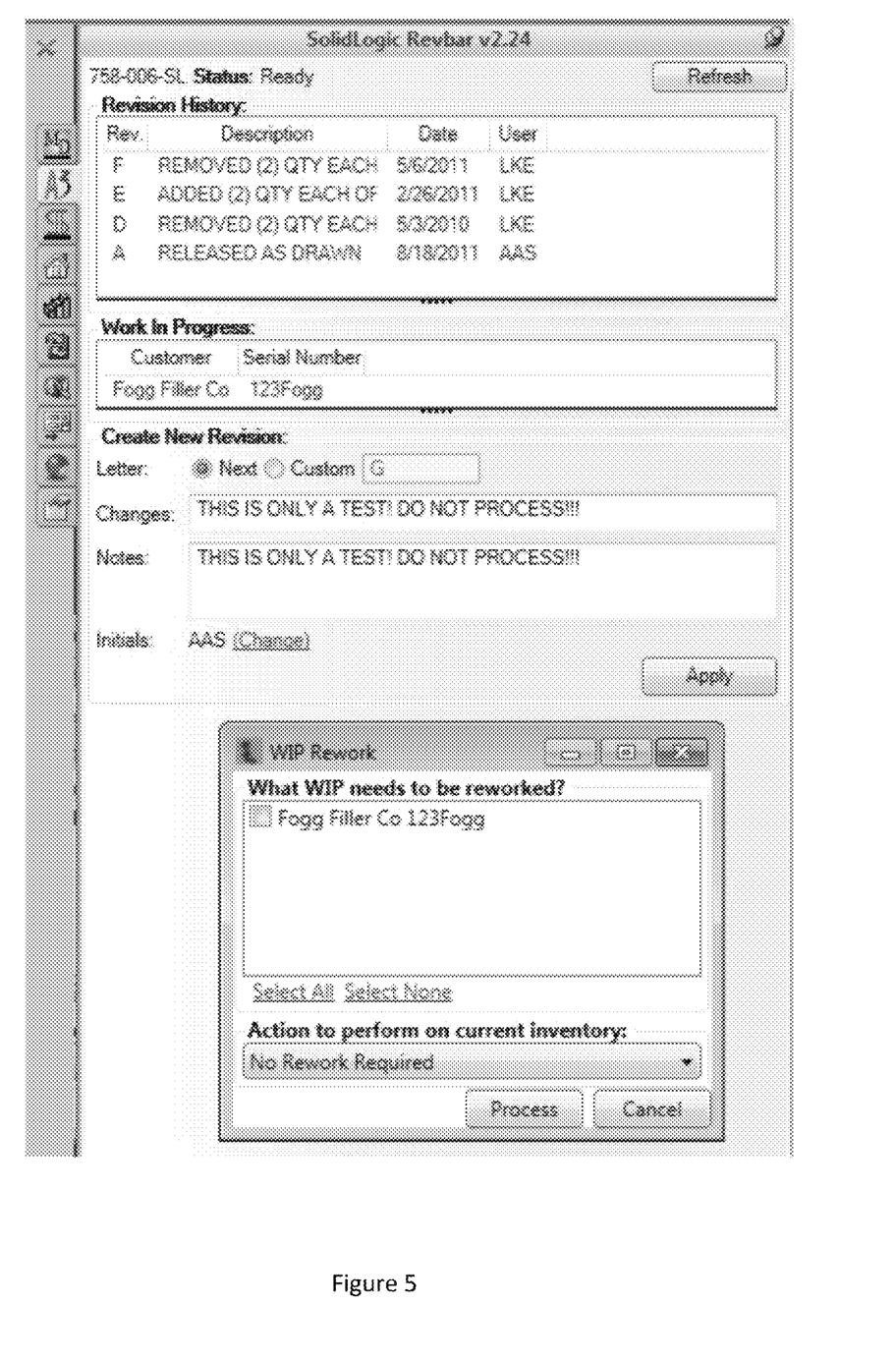
FIG. 5 of the drawings is a sample window display within the CAD software (SolidWorks in this embodiment) of the Revision Add-in utilizing the principles of the present disclosure.

The third add-in that is utilized as part of the system includes a revision add-in. The revision add-in overcomes the problems with ensuring that when revisions are made, that these revisions are tracked through the remainder of the ERP system so that the proper parts and components are made, utilized and assembled.

In the preferred embodiment of the system, and with reference to FIG. 5, for any assembly component, the system provides data as to any revisions that have been made (i.e., the revision history). The system also provides the user with information as to whether the component is currently being made for use in any current and open job that is being filled. In addition, where the user is making a new revision, the system prompts for information as to the name of the revision (typically a sequential lettering scheme), the changes that were made, and notes associated with the changes. The user (or users) that is making the revision is also identified. This data is written to the database associated with the particular drawing of the component.

Once the revision is applied, the user will be prompted to solve issues that arise in the area of jobs which are in process and also in inventory. It will be understood that for jobs in process, a revision presents an issue, which is whether to apply the revision to the component in the current job, or apply it only to future jobs. Additionally, with respect to inventory, a revision presents an issue. The issue is whether the current inventory should be discarded, utilized without the revision, or modified according to the revision. The user can specify what is done with current inventory before applying the revision. Once these decisions have been made, the system provides the appropriate alerts and tasks to the correct responsible individuals.

Referring again to FIG. 2, these three add-ins interface with the remainder of the ERP system in a bi-directional manner. As a result, the engineer or designer instantly becomes aware as to what changes have been made by others which impact the designer. For example, if there are changes to the job, components or to deadlines, these become visible within the designing software, through the add-in. Additionally, information from the engineers and designers becomes available to others when the information is relevant. For example, a supervisor can quickly analyze the progress with respect to a job, or an engineer as the data from the designing software (as to completed components and parts) is provided directly via the add-ins to the job scheduling software. In addition, when revisions are made, purchasing is immediately notified, which is significant because of the impact the revisions have on current jobs, existing inventory, and equipment in the field.

The foregoing description merely explains and illustrates the invention and the invention is not limited thereto except insofar as the appended claims are so limited, as those skilled in the art who have the disclosure before them will be able to make modifications without departing from the scope of the invention.

What is claimed is:

1. One or more computer-readable memory comprising computer-executable instructions for providing bi-directional communication with a CAD system, the computer-executable instructions performing steps comprising:

obtaining at least one drawing pertaining to at least one part within the CAD system, the at least one drawing pertaining to a part of a machine;

revising the at least one drawing within the CAD system forming a revision;

providing at least one of the quantity of the part that has been manufactured and the applicability of the part outside of the machine;

receiving from the user a first determination as to the need for executing the revision on the quantity of the part that has been manufactured;

receiving from the user a second determination as to the applicability of the revision outside of the use in the machine;

instructing manufacturing to the determination as to the need for executing the revision on the quantity of the part that has been manufactured;

instructing manufacturing to the determination as to the applicability of the revision outside of the use in the machine.

2. The one or more computer-readable memory of claim 1, wherein the step of providing further comprises the step of providing the quantity of the part that has been manufactured and the applicability of the part outside of the machine.

3. The one or more computer-readable memory of claim 2 wherein the step of providing further comprises the step of providing a plurality of other machines for which the part is applicable outside of the machine.

4. The one or more computer-readable memory of claim 3 wherein the step of receiving from the user a first determination further comprises the step of receiving from the user a first determination that the revision is to be executed on the quantity of the part that has been manufactured.

5. The one or more computer-readable memory of claim 4 wherein the step of receiving from the user a second determination further comprises the step of receiving from the user a second determination that the revision is at least partially inapplicable outside of the use in the machine.

* * * * *